United States Patent
Xian et al.

(10) Patent No.: US 11,257,825 B1
(45) Date of Patent: Feb. 22, 2022

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); TSMC Nanjing Company Limited, Nanjing (CN)

(72) Inventors: Huai-Xin Xian, Nanjing (CN); Yang Zhou, Nanjing (CN); Qing-Chao Meng, Shanghai (CN)

(73) Assignees: Taiwan Semiconductor Manufacturing Co., Ltd., Hsinchu (TW); TSMC Nanjing Company Limited, Nanjing (CN)

( * ) Notice: Subject to any disclaimer, the term of this patent is extended or adjusted under 35 U.S.C. 154(b) by 0 days.

(21) Appl. No.: 17/082,856

(22) Filed: Oct. 28, 2020

(30) Foreign Application Priority Data

Oct. 12, 2020 (CN) .......................... 202011082943.5

(51) Int. Cl.
| | |
|---|---|
| *G11C 11/00* | (2006.01) |
| *H01L 27/11* | (2006.01) |
| *G06F 30/392* | (2020.01) |
| *H03K 3/037* | (2006.01) |
| *G11C 11/412* | (2006.01) |

(52) U.S. Cl.
CPC ........ *H01L 27/1104* (2013.01); *G06F 30/392* (2020.01); *G11C 11/412* (2013.01); *H03K 3/0372* (2013.01)

(58) Field of Classification Search
CPC . H01L 27/1104; G06F 30/392; G11C 11/412; H03K 3/0372

USPC .......................................................... 365/154
See application file for complete search history.

(56) References Cited

U.S. PATENT DOCUMENTS

| | | | | |
|---|---|---|---|---|
| 5,162,667 | A * | 11/1992 | Yasui | G06F 1/32 326/93 |
| 5,440,569 | A * | 8/1995 | Naito | G01R 31/318541 714/726 |
| 5,783,958 | A * | 7/1998 | Lysinger | H03K 3/0372 327/202 |
| 6,518,810 | B1 * | 2/2003 | Takahashi | H03K 3/012 327/202 |
| 7,346,820 | B2 * | 3/2008 | Padhye | G01R 31/318541 714/726 |
| 10,340,898 | B1 * | 7/2019 | Ganusov | H03K 3/0372 |
| 2008/0159042 | A1 * | 7/2008 | Bertin | H01L 27/112 365/225.7 |

(Continued)

*Primary Examiner* — Viet Q Nguyen
(74) *Attorney, Agent, or Firm* — Birch, Stewart, Kolasch & Birch, LLP

(57) ABSTRACT

A device includes a master latch, a slave latch and a retention latch coupled to each other. The retention latch includes first and second active areas, first and second gate structures. The first and second active areas extend in a first direction. The first gate structure extends in a second direction, the first gate structure including first and second portions that are separated from each other. The first portion is arranged over the first active area, and the second portion is arranged over the second active area. The second gate structure extends in the second direction, and is arranged over the first active area. The second gate structure is separated from the second active area and the first gate structure in a layout view. An end portion of the second active area is between the first gate structure and the second gate structure.

20 Claims, 5 Drawing Sheets

(56) References Cited

U.S. PATENT DOCUMENTS

| | | | |
|---|---|---|---|
| 2009/0146686 A1* | 6/2009 | Voogel | H03K 19/0008 |
| | | | 326/38 |
| 2009/0290434 A1* | 11/2009 | Kurjanowicz | G11C 5/143 |
| | | | 365/189.05 |
| 2014/0145772 A1* | 5/2014 | Kuenemund | G11C 11/41 |
| | | | 327/202 |
| 2018/0019734 A1* | 1/2018 | Vattikonda | H03K 3/0372 |

* cited by examiner

SEMICONDUCTOR DEVICE AND MANUFACTURING METHOD THEREOF

PRIORITY CLAIM AND CROSS-REFERENCE

This application claims priority to China Application Serial Number 202011082943.5, filed on Oct. 12, 2020, the entirety of which is herein incorporated by reference.

BACKGROUND

Electronic devices sometimes include one or more portions that are powered down while not in use to conserve energy and prolong battery life. To provide continuity, data bits are often saved prior to a power down event, then restored to their previous circuit locations once the powered down portion has been powered on again. The data bits typically are saved using latch circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
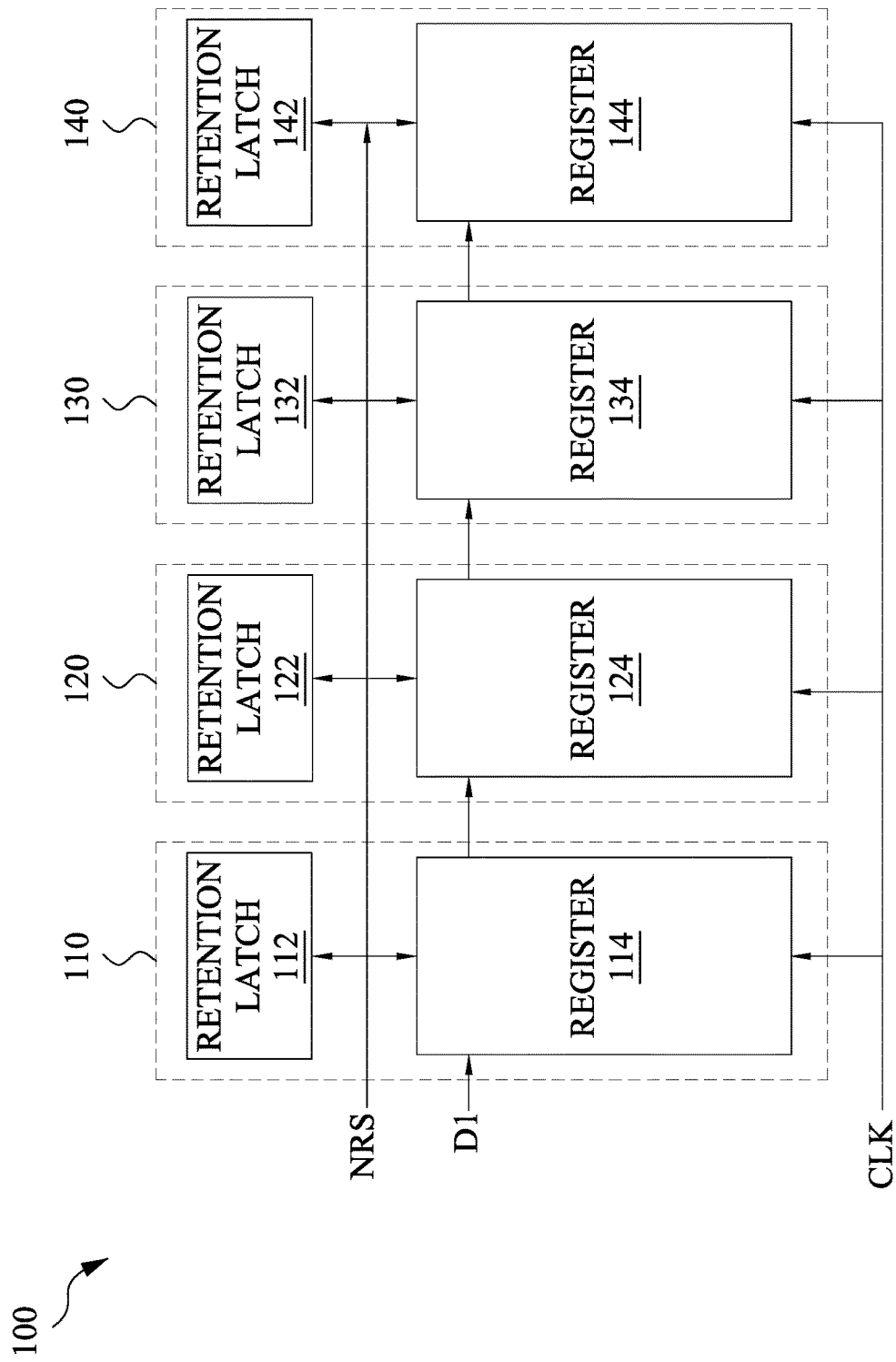
FIG. 1 is a schematic diagram of a device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a device in accordance with some embodiments of the present disclosure. As illustratively shown in FIG. 1, a device 100 includes circuits 110, 120, 130 and 140. In some embodiments, the device 100 is configured in a retention flip-flop device. In some embodiments, the device 100 is used to retain status in retention mode by latching data bits on retention latches.

In some embodiments, each of the circuits 110, 120, 130 and 140 includes a retention latch and a register. For illustration of FIG. 1, the circuits 110, 120, 130 and 140 include retention latches 112, 122, 132, and 142, respectively, and also include registers 114, 124, 134 and 144, respectively. In some embodiments, the term "retention latch" is also referred to as "balloon latch."

The registers 114, 124, 134 and 144 are configured to operate according to a clock signal CLK and latch bits of a data signal D1. The retention latches 112, 122, 132 and 142 are configured to receive the bits of the data signal D1 from the corresponding registers 114, 124, 134 and 144, and latch the bits of the data signal D1 when the device 100 enters into the retention mode. When the retention mode is over, the retention latches 112, 122, 132 and 142 are configured to output the bits of the data signal D1 back to the corresponding registers 114, 124, 134 and 144 according to a restore signal NRS.

In some embodiments, the retention latch 112 is configured to latch a bit of the data signal D1 when the circuit 110 is in a retention mode, and transmit the bit of the data signal D1 back to the register 114 to restore the state of the output signal of the register 114 when the circuit 110 turns to an active mode from the retention mode.

The numbers of devices, retention latches and registers in FIG. 1 are given for illustrative purposes. Various numbers of devices, retention latches and registers in FIG. 1 are within the contemplated scope of the present disclosure. For example, to increase the number of bits which are able to be latched by the device 100, the numbers of devices, retention latches or registers are positive integers larger than four in some embodiments.

Figure 2:
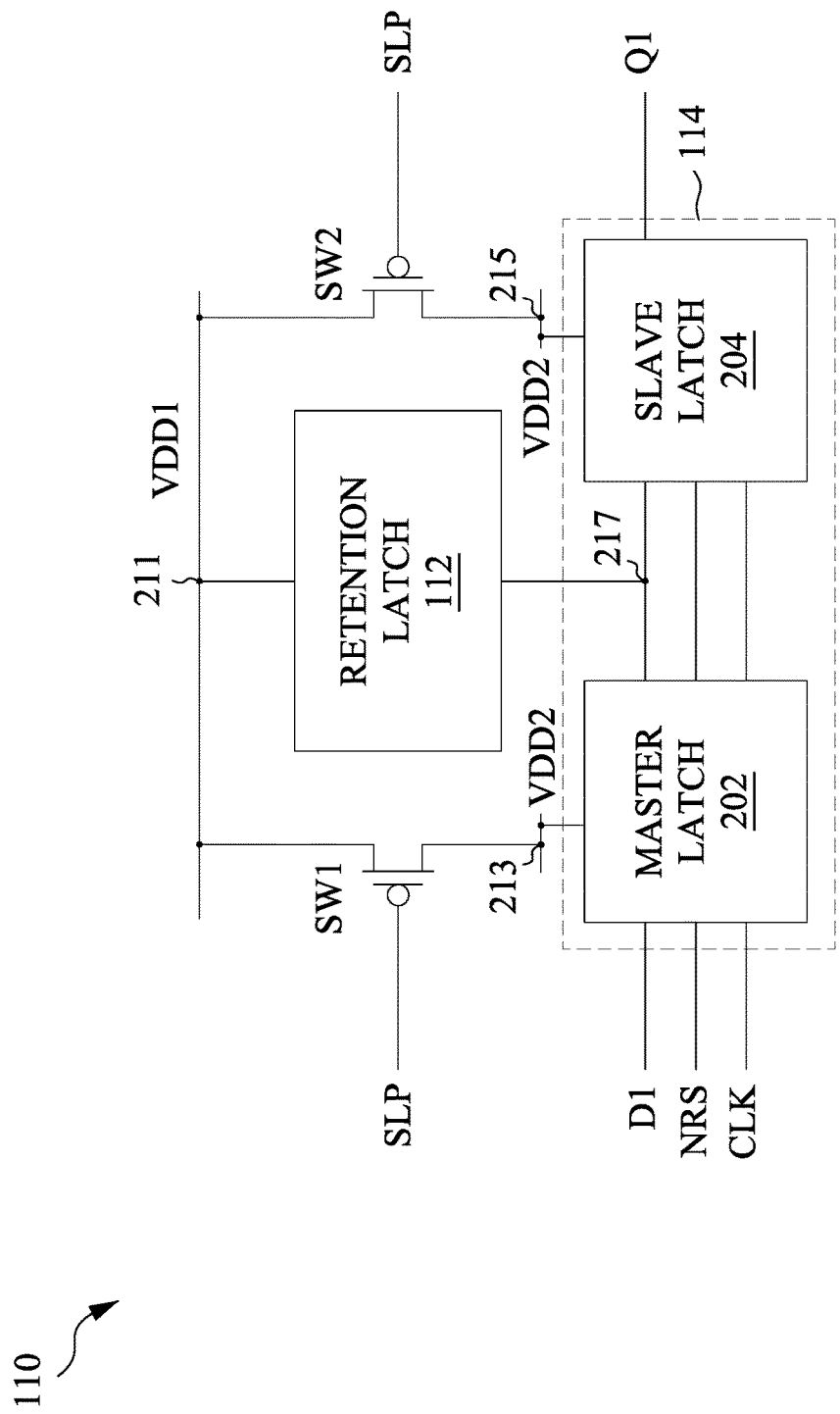
FIG. 2 is a schematic diagram of the circuit 110 of FIG. 1, in accordance with some embodiments of the present disclosure.

FIG. 2 is a schematic diagram of the circuit 110 of FIG. 1, in accordance with some embodiments of the present disclosure. In FIG. 2, the circuit 110 includes the retention latch 112, the register 114, and switches SW1 and SW2.

In some embodiments, the switch SW1 is coupled between a power supply voltage terminal VDD1 and a node 213, and the switch SW2 is coupled between the power supply voltage terminal VDD1 and a node 215. The power supply voltage terminal VDD1 is configured to receive a power supply voltage in some embodiments. The register 114 is coupled to a power supply voltage terminal VDD2 at the nodes 213 and 215. The power supply voltage terminal VDD2 is powered up to turn the register 114 to the active mode when the switches SW1 and SW2 are turned on, and turn the register 114 to the retention mode when the switches SW1 and SW2 are turned off. In some embodiments, the switches SW1 and SW2 are configured to be controlled by a signal SLP. Alternatively stated, the circuit 110 is operated in the retention mode or in the active mode based on the signal SLP.

In some embodiments, the retention latch 122 includes a master latch 202 and a slave latch 204, and the master latch 202 is coupled to the slave latch 204. The master latch 202 is configured to receive the data signal D1 and transmit the data signal D1 to the slave latch 204. The slave latch 204 is configured to output a signal Q1 according to the clock signal CLK and the data signal D1. In some embodiments, the signal Q1 has a state of the data signal D1 at a moment of a positive edge (or negative edge, depending on the type of the slave latch 204) of the clock signal CLK. Otherwise, the signal Q1 holds a previous state. Alternatively stated, the slave latch 204 latches a bit of the data signal D1 and outputs the latched bit corresponding to the signal Q1 when the register 114 is not triggered by the clock signal CLK.

In some embodiments, the master latch 202 and the slave latch 204 are coupled to the power supply voltage terminal VDD2 at the nodes 213 and 215, respectively. The switches SW1 is coupled between the power supply voltage terminal VDD1 and the node 213, and the switch SW2 is coupled between the power supply voltage terminal VDD1 and the node 215. When the switches SW1 and SW2 are turned off, the master latch 202 and the slave latch 204 are powered down and turn to the retention mode. When the switches SW1 and SW2 are turned on, the master latch 202 and the slave latch 204 are powered up and turn to the active mode. In some embodiments, the retention latch 112 is configured to latch a bit of the data signal D1 at the retention mode, and transmit the bit of the data signal D1 back to the master latch 202 and the slave latch 204 through a via 217 to restore the state of the signal Q1 when the circuit 110 turns to the active mode from the retention mode.

Figure 3:
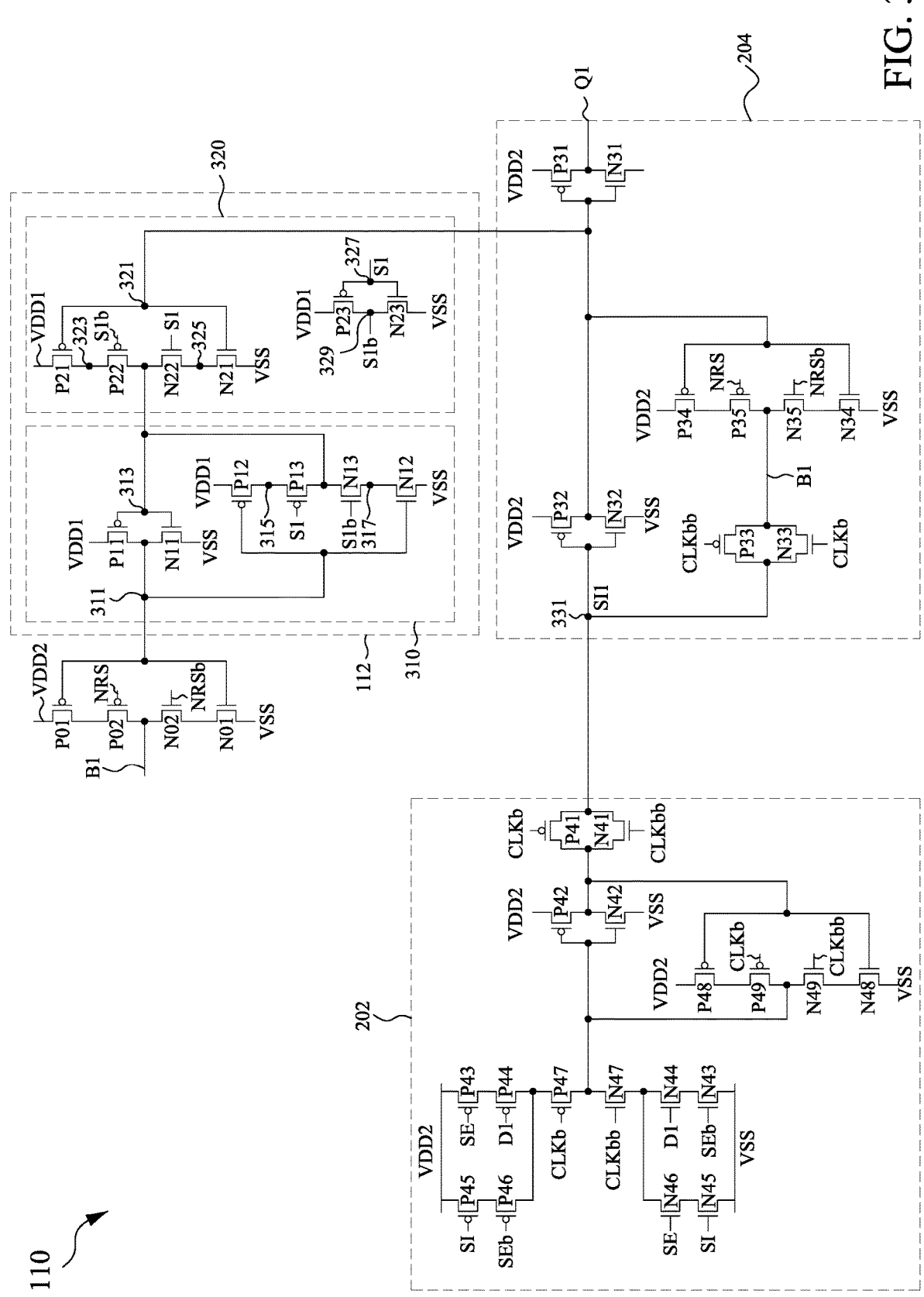
FIG. 3 is a circuit diagram of the circuit 110 in FIG. 2 in accordance with some embodiments of the present disclosure.

FIG. 3 is a circuit diagram of the circuit 110 in FIG. 2 in accordance with some embodiments of the present disclosure. As illustratively shown in FIG. 3, the circuit 110 includes the retention latch 112, the master latch 202 and the slave latch 204.

As illustratively shown in FIG. 3, the retention latch 112 includes a latch unit 310 and a transmission unit 320. The latch unit 310 is configured to latch a bit of the data signal D1. The transmission unit 320 is configured to transmit the bit of the data signal D1 between the slave latch 204 and the retention latch 112 according to a signal S1.

As illustratively shown in FIG. 3, the latch unit 310 includes p-type transistors P11-P13 and n-type transistors N11-N13. The transistors P11 and N11 are coupled in series between the power supply voltage terminal VDD1 and a reference voltage terminal VSS. Sources of the transistors P11 and N11 are coupled to the power supply voltage terminal VDD1 and the reference voltage terminal VSS, respectively. Drains of the transistors P11 and N11 are coupled to each other at a node 311. Control terminals of the transistors P11 and N11 are coupled to each other at a node 313. In some embodiments, the transistors P11 and N11 are configured to operate as an inverter coupled between the nodes 311 and 313. The reference voltage terminal VSS is configured to receive a ground voltage in some embodiments.

As illustratively shown in FIG. 3, the transistors P12, P13, N13 and N12 are coupled in series between the power supply voltage terminal VDD1 and the reference voltage terminal VSS. Sources of the transistors P12 and N12 are coupled to the power supply voltage terminal VDD1 and the reference voltage terminal VSS, respectively. Drains of the transistors P13 and N13 are coupled to each other at the node 313. Control terminals of the transistors P12 and N12 are coupled to each other at a node 311. A drain of the transistor P12 and a source of the transistor P13 are coupled to each other at a node 315. A drain of the transistor N12 and a source of the transistor N13 are coupled to each other at a node 317. In some embodiments, a control terminal of the transistor P13 is configured to receive the signal S1, and a control terminal of the transistor N13 is configured to receive a signal S1b which is the complementary of the signal S1. In some embodiments, the transistors P12, P13, N13 and N12 are configured to operate as an inverter coupled to a transmission gate between the nodes 311 and 313. In these embodiments, the transistors P12 and N12 correspond to the inverter, and the transistors P13 and N13 correspond to the transmission gate.

As illustratively shown in FIG. 3, the transmission unit 320 includes p-type transistors P21-P23 and n-type transistors N21-N23. The transistors P23 and N23 are coupled in series between the power supply voltage terminal VDD1 and the reference voltage terminal VSS. Sources of the transistors P23 and N23 are coupled to the power supply voltage terminal VDD1 and the reference voltage terminal VSS, respectively. Control terminals of the transistors P23 and N23 are coupled to each other at a node 327 corresponding to the signal S1. Drains of the transistors P23 and N23 coupled to each other at a node 329 corresponding to the signal S1b as the complementary of the signal S1. In some embodiments, the transistors P23 and N23 are configured to operate as an inverter which inverts the signal S1 to the signal S1b. In some embodiments, the inverter including the transistors P23 and N23 is coupled between the control terminals of transistors P13 and N13 and also coupled between control terminals of transistors P22 and N22.

As illustratively shown in FIG. 3, the transistors P21, P22, N22 and N21 are coupled in series between the power supply voltage terminal VDD1 and the reference voltage terminal VSS. Sources of the transistors P21 and N21 are coupled to the power supply voltage terminal VDD1 and the reference voltage terminal VSS, respectively. Drains of the transistors P22 and N22 are coupled to each other at the node 313. Control terminals of the transistors P21 and N21 are coupled to each other at a node 321. A drain of the transistor P21 and a source of the transistor P22 are coupled to each other at a node 323. A drain of the transistor N21 and a source of the transistor N22 are coupled to each other at a node 325. A control terminal of the transistor N22 is configured to receive a signal S1, and a control terminal of the transistor P22 is configured to receive the signal S1b. In some embodiments, the transistors P21, P22, N22 and N21 are configured to operate as an inverter coupled to a transmission gate between the nodes 321 and 313. In these embodiments, the transistors P12 and N12 are correspond to the inverter and the transistors P13 and N13 are correspond to the transmission gate.

As illustratively shown in FIG. 3, the master latch 202 is configured to operate according to signals SI, SIb, CLKb and CLKbb. The signal CLKb is the complementary of the clock signal CLK. The signals SIb and CLKbb are the complementary of the signals SI and CLKb, respectively. As illustratively shown in FIG. 3, the slave latch 204 is configured to operate according to the restore signal NRS and the signal NRSb which is the complementary of the restore signal NRS.

In some embodiments, each of the circuits 120, 130 and 140 in FIG. 1 has a configuration similar to that of the circuit 110 shown in FIG. 2 and/or FIG. 3. For example, the circuit 120 includes a retention latch, a master latch, a slave latch, and switches (not shown) that are configured as those of the circuit 110 shown in FIG. 2, and thus they are not further detailed herein. In some embodiments, the master latch of the circuit 120 is configured to receive a signal SI1 at a node 331 in FIG. 3. For another example, the retention latch of the circuit 120 includes a latch unit and a transmission unit (not shown) that are configured as those of the retention latch 112 shown in FIG. 3, and thus they are not further detailed herein.

Figure 4:
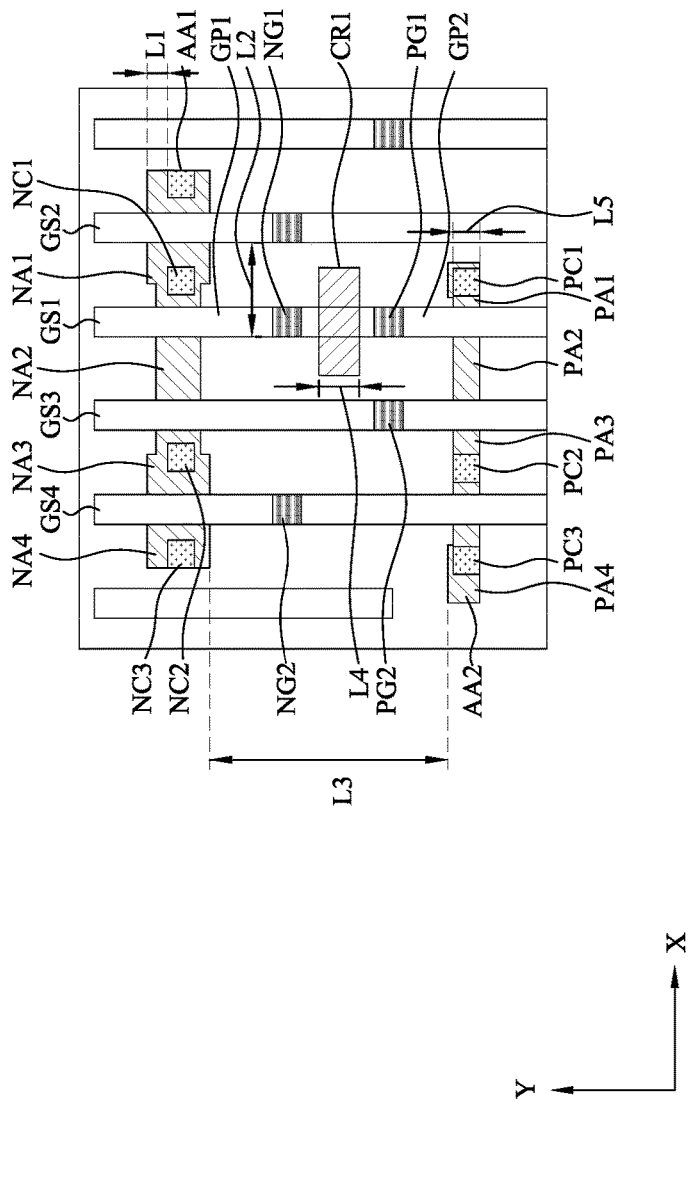
FIG. 4 is a schematic layout 400 of an integrated circuit including structures corresponding to latch unit 310 within the retention latch 112 in FIG. 3, in accordance with some embodiments of the present disclosure.

FIG. 4 is a schematic layout 400 of an integrated circuit including structures corresponding to the latch unit 310 in the retention latch 112 in FIG. 3, in accordance with some embodiments of the present disclosure. In some embodiments, the schematic layout 400 is implemented by a CAD (computer aided design) layer of a static random access memory (SRAM) bit-cell. The CAD layer of the SRAM bit-cell is also referred to as a standard cell of the SRAM, and the standard cell is selected from a cell library used for the SRAM design, in some embodiments. For simplicity of illustration, the schematic layout 400 only shows a portion of structures, and the other portion of structures as can be known by one of ordinary skill in the art is not detailed in FIG. 4.

As illustratively shown in FIG. 4, the schematic layout 400 includes active areas AA1, AA2 and gate structures GS1-GS4. In some embodiments, the active areas AA1 and AA2 extend in, for example, an X direction, and the gate structures GS1-GS4 extend in, for example, a Y direction different from the X direction. As illustratively shown in FIG. 4, the gate structures GS1, GS3 and GS4 are crossing over the active areas AA1 and AA2. The gate structure GS2 is crossing over the active area AA1 and separating from the active area AA2. In some embodiments, the active areas AA1, AA2 are formed by using semiconductor material to be doped regions. In some embodiments, the gate structures GS1-GS4 are implemented by polysilicon, metal, doped polysilicon, or other suitable material. In some embodiments, fin structures including the gate structures GS1-GS4 are formed over the active areas AA1 and AA2, to form Fin Field-Effect Transistors (FinFETs).

In some embodiments, each one of the active areas AA1, AA2 has at least one doped region corresponding to a source or a drain of a transistor. As illustratively shown in FIG. 4, the active area AA1 includes doped regions NA1-NA4, and the active area AA2 includes doped regions PA1-PA4.

In some embodiments, the schematic layout 400 shares a CAD layer of a SRAM bit cell design. Therefore, the schematic layout 400 has the same size and approximately the same layout pattern of the SRAM design. The gate structures GS1, GS3, GS4 are arranged across the active areas AA1 and AA2, while the gate structure GS2 is arranged across the active area AA1 but separated from the active area AA2 in a layout view as illustratively shown in FIG. 4. The doped region PA1 corresponding to an end portion of the active area AA2 is arranged between the gate structures GS1 and GS2, in the layout view. In some embodiments, a distance between the gate structures GS1 and GS2 is a gate pitch, and a distance between the gate structure GS2 and the doped region PA1 is shorter than the gate pitch in the layout view as illustratively shown in FIG. 4.

In some embodiments, the gate structures GS1, GS3, GS4 are arranged for forming the transistors P11-P13 and N11-N13 in FIG. 3. The gate structure GS1 is cut and separated by a cut segment CR1 into gate portions GP1 and GP2. The gate portion GP1 is arranged over the active area AA1 and the gate portion GP2 is arranged over the active area AA2. The doped regions NA1 and NA2 are placed at two opposite sides of the gate portion GP1. The doped regions PA1 and PA2 are placed at two opposite sides of the gate portion GP2.

For illustration of FIG. 4 with reference to FIG. 3, the doped regions NA1 and NA2 of the active area AA1 together with the gate portion GP1 correspond to the transistor N13. Correspondingly, the doped regions PA1 and PA2 of the active area AA2 together with the gate portion GP2 correspond to the transistor P13.

As illustratively shown in FIG. 4, the gate structure GS3 is a continuous gate arranged over the active areas AA1 and AA2. The doped regions NA2, NA3 of the active area AA1 are placed at two opposite sides of the gate structure GS3. The doped regions PA2, PA3 of the active area AA2 are also placed at the two opposite sides of the gate structure GS3.

For illustration of FIG. 4 with reference to FIG. 3, the doped regions NA2 and NA3 of the active area AA1 together with the gate structure GS3 correspond to the transistor N12. The doped regions PA2 and PA3 of the active area AA2 together with the gate structure GS3 correspond to the transistor P12.

As illustratively shown in FIG. 4, the gate structure GS4 is a continuous gate arranged over the active areas AA1 and AA2. The doped regions NA4, NA3 of the active area AA1 are placed at the two opposite sides of the gate structure GS4. The doped regions PA4, PA3 of the active area AA2 are also placed at the two opposite sides of the gate structure GS4.

For illustration of FIG. 4 with reference to FIG. 3, the doped regions NA3 and NA4 of the active area AA1 together with the gate structure GS4 correspond to the transistor N11. The doped regions PA3 and PA4 of the active area AA2 together with the gate structure GS4 correspond to the transistor P11.

For illustration of FIG. 4 with reference to FIG. 3, in some embodiments, the doped region NA2 is shared by the source of the transistor N13 and the drain of the transistor N12, which corresponds to the node 317. The doped region PA2 is shared by the source of the transistor P13 and the drain of the transistor P12, which corresponds to the node 315.

For illustration of FIG. 4 with reference to FIG. 3, in some embodiments, the gate portion GP1 which corresponds to the control terminal of the transistor N13 is configured to receive the signal S1b through a via NG1. In some embodiments, the gate portion GP2 which corresponds to the control terminal of the transistor P13 is configured to receive the signal S1 through a via PG1. The doped regions NA3 is coupled to the reference voltage terminal VSS through a via NC2 which corresponds to the sources of the transistors N11 and N12. The doped regions PA3 is coupled to the power supply voltage terminal VDD1 through a via PC2 which corresponds to the sources of the transistors P11 and P12.

For illustration of FIG. 4 with reference to FIG. 3, in some embodiments, the doped regions PA1 and NA1 and the gate structure GS4 are coupled to each other through vias PC1, NC1 and NG2, which corresponding to transistors P13, N13, P11 and N11 are coupled to each other at the node 313 in FIG. 3. The doped regions PA4 and NA4 and the gate structure GS3 are coupled to each other via nodes NC3, PC3 and PG2, which corresponding to transistors P11, N11, P12 and N12 are coupled to each other at the node 311 in FIG. 3.

In some approaches, a device corresponding to the device 100 as discussed above operates in a retention mode by a latch corresponding to, for example, the retention latch 112 of FIG. 1. To reduce leakage generated in the retention mode, the latch in the above approaches is implemented by elements with a higher threshold voltage. However, manufacturing the elements with the higher threshold voltage requires additional masks in manufacturing processes.

Compared to the above approaches, in some embodiments of the present disclosure, the concept of utilizing the CAD layer of a SRAM bit-cell to implement, for example, the retention latch 112 of FIG. 1, is introduced. For example, the schematic layout 400 of FIG. 4 which corresponds to the SRAM bit-cell is configured to implement the latch unit 310 in the retention latch 112 in FIG. 3, as discussed above. Because the SRAM design has a relatively higher threshold voltage performance which causes low leakage, using the schematic layout 400 corresponding to the SRAM bit-cell to implement circuits of the device 100 is able to reduce the leakage as discussed above, and the additional masks in the above approaches is not required. In some embodiments, using the embodiments of the present disclosure to implement, for example, at least one of the retention latches 112, 122, 132, 142 of FIG. 1 is able to reduce 75% of leakage generated in the above approaches.

In some embodiments, each of the retention latches 112, 122, 132, 142 of FIG. 1 is fabricated by one or more masks associated with the SRAM design. In such embodiments, the number of masks required in a manufacturing process of each of the retention latches 112, 122, 132, 142 of FIG. 1 is smaller than that required in the above approaches. In various embodiments, the number of the masks required for each of the retention latches 112, 122, 132, 142 of FIG. 1 is 50% of the number of the masks required for the above approaches.

In some embodiments, size parameters L1-L5 of the schematic layout 400 of the SRAM design are smaller than corresponding size parameters of the above approaches. The size parameters L1-L5 are corresponding to an enclosure contact space of the active area AA1, the gate pitch between the gate structures GS1 and GS2, a distance between the active areas AA1 and AA2, a width of the cut segment CR1, and a width of the active area AA2, respectively. In various embodiments, an area required for each of the retention latches 112, 122, 132, 142 of FIG. 1 is smaller than an area required for the above approaches.

In some embodiments, the retention latch 112 is implemented by a CAD layer of the SRAM design including at least one SRAM block. In some embodiments, a distance between the retention latch 112 and the at least one SRAM block on the bit cell CAD layer is in a range of 10-500 gate pitches. In some other embodiments, a distance between the retention latch 112 and the at least one SRAM block is larger than 500 gate pitches. Various distances between the retention latch 112 and the at least one SRAM block are within the contemplated scope of the present disclosure.

Figure 5:
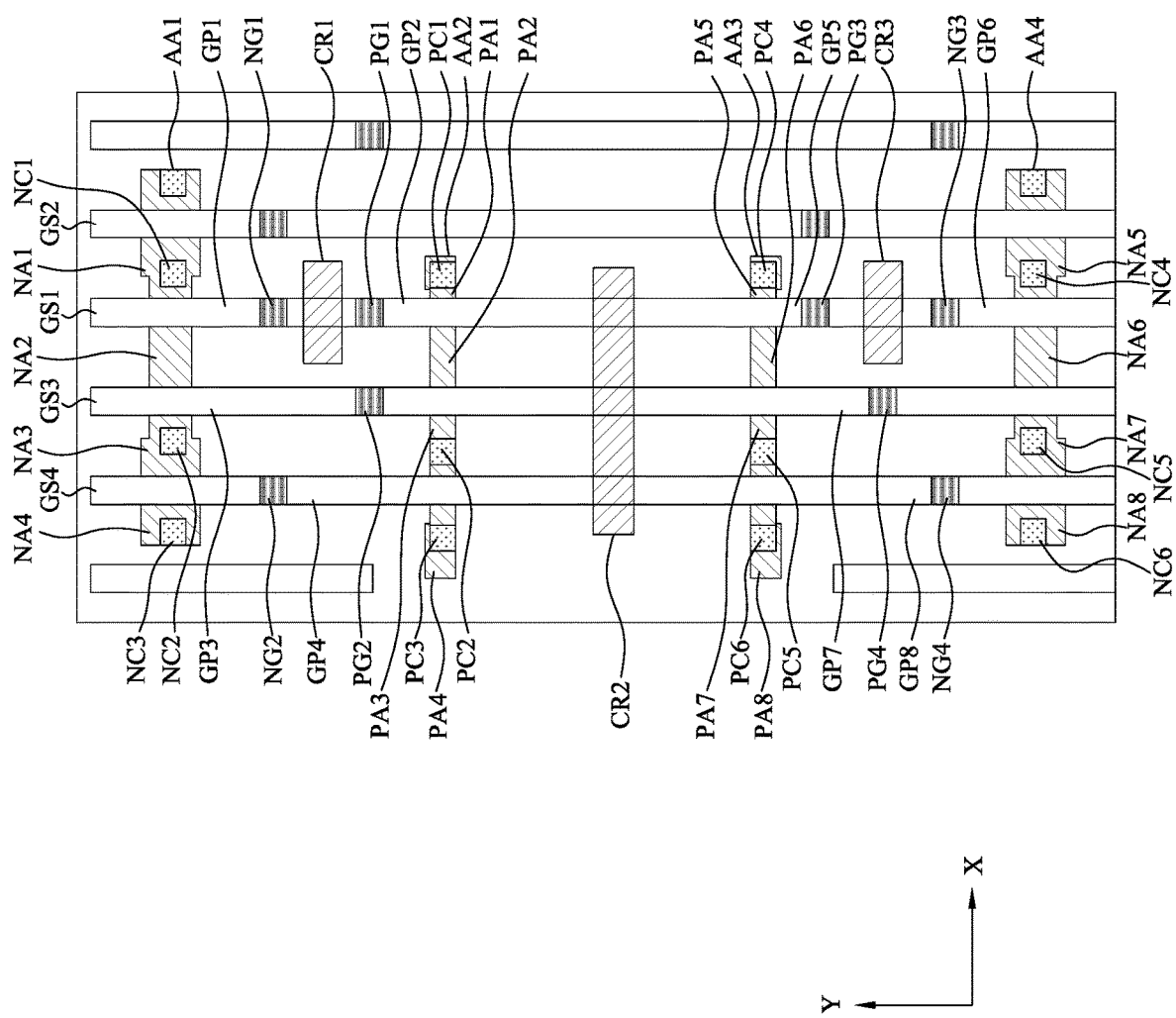
FIG. 5 is a schematic layout 500 of an integrated circuit including structures corresponding to latch unit 310 and the transmission unit 320 within the retention latch 112 in FIG. 3, in accordance with some embodiments of the present disclosure.

FIG. 5 is a schematic layout 500 of an integrated circuit including structures corresponding to latch unit 310 and the transmission unit 320 in the retention latch 112 in FIG. 3, in accordance with some embodiments of the present disclosure. In some embodiments, the schematic layout 500 is implemented by a CAD layer of SRAM bit-cells. For simplicity of illustration, the schematic layout 500 only shows a portion of structures, and the other portion of structures as can be known by one of ordinary skill in the art is not detailed in FIG. 5.

For illustration of FIG. 5 with reference to FIG. 4, the upper half of the schematic layout 500 is similar to the schematic layout 400. FIG. 5 follows a similar labeling convention to that of FIG. 4. For brevity, the discussion will focus more on differences between FIG. 4 and FIG. 5 than on similarities.

As illustratively shown in FIG. 5, the schematic layout 500 includes active areas AA1-AA4 and gate structures GS1-GS4. In some embodiments, the active areas AA1-AA4 extend in, for example, an X direction, and the gate structures GS1-GS4 extend in, for example, a Y direction different from the X direction. As illustratively shown in FIG. 5, the gate structures GS1, GS3 and GS4 are crossing over the active areas AA1-AA4. The gate structure GS2 is crossing over the active areas AA1, AA4 and separating from the active areas AA2, AA3. In some embodiments, the active areas AA1-AA4 are formed by using semiconductor material to be doped regions. In some embodiments, the gate structures GS1-GS4 are implemented by polysilicon, metal, doped polysilicon, or other suitable material. In some embodiments, fin structures including the gate structures GS1-GS4 are formed over the active areas AA1-AA4, to form Fin Field-Effect Transistors (FinFETs).

In some embodiments, each one of the active areas AA1-AA4 has at least one doped region corresponding to a source or a drain of a transistor. As illustratively shown in FIG. 5, the active area AA1 includes doped regions NA1-NA4, the active area AA2 includes doped regions PA1-PA4, the active area AA3 includes doped regions PA5-PA8, and the active area AA4 includes doped regions NA5-NA8.

In some embodiments, the schematic layout 500 shares a bit cell CAD layer of a SRAM design. Therefore, the schematic layout 500 has the same size and approximately the same layout pattern of the SRAM design. The gate structures GS1, GS3, GS4 are arranged across the active areas AA1-AA4, while the gate structure GS2 is arranged across the active areas AA1 and AA4 but separated from the active areas AA2 and AA3 in a layout view as illustratively shown in FIG. 5. The doped region PA1 corresponding to an end portion of the active area AA2 is arranged between the gate structures GS1 and GS2, in the layout view. The doped region PA5 corresponding to an end portion of the active area AA3 is arranged between the gate structures GS1 and GS2, in the layout view. In some embodiments, a distance between the gate structures GS1 and GS2 is a gate pitch, and a distance between the gate structure GS2 and the doped region PA1, and a distance between the gate structure GS2 and the doped region PA5, are both shorter than the gate pitch in the layout view as illustratively shown in FIG. 5.

In some embodiments, the gate structures GS1, GS3, GS4 are arranged for forming the transistors P11-P13, P21-P23, N11-N13 and N21-N23 in FIG. 3. The gate structure GS1 is cut and separated by the cut segments CR1-CR3 into gate portions GP1, GP2, GP5 and GP6. The gate portions GP1, GP2, GP5 and GP6 are arranged over the active areas AA1-AA4, respectively. The doped regions NA1 and NA2 are placed at two opposite sides of the gate portion GP1. The doped regions PA1 and PA2 are placed at two opposite sides of the gate portion GP2. The doped regions NA5 and NA6 are placed at two opposite sides of the gate portion GP6. The doped regions PA5 and PA6 are placed at two opposite sides of the gate portion GP5.

For illustration of FIG. 5 with reference to FIG. 3, the doped regions NA1 and NA2 of the active area AA1 together with the gate portion GP1 correspond to the transistor N13. Correspondingly, the doped regions PA1 and PA2 of the active area AA2 together with the gate portion GP2 correspond to the transistor P13. The doped regions PA5 and PA6 of the active area AA3 together with the gate portion GP5 correspond to the transistor P22. The doped regions NA5 and NA6 of the active area AA4 together with the gate portion GP6 correspond to the transistor N22.

As illustratively shown in FIG. 5, the gate structure GS3 is cut and separated by the cut segment CR2 into gate portions GP3 and GP7. The gate portion GP3 is arranged over the active areas AA1 and AA2. The doped regions NA2, NA3 of the active area AA1 are placed at two opposite sides of the gate portion GP3. The doped regions PA2, PA3 of the active area AA2 are also placed at the two opposite sides of the gate portion GP3.

For illustration of FIG. 5 with reference to FIG. 3, the doped regions NA2 and NA3 of the active area AA1 together with the gate portion GP3 correspond to the transistor N12. The doped regions PA2 and PA3 of the active area AA2 together with the gate portion GP3 correspond to the transistor P12.

As illustratively shown in FIG. 5, the gate portion GP7 is arranged over the active areas AA3 and AA4. The doped regions PA6, PA7 of the active area AA3 are placed at two opposite sides of the gate portion GP7. The doped regions NA6, NA7 of the active area AA4 are also placed at the two opposite sides of the gate portion GP7.

For illustration of FIG. 5 with reference to FIG. 3, the doped regions NA6 and NA7 of the active area AA4 together with the gate portion GP7 correspond to the transistor N21. The doped regions PA6 and PA7 of the active area AA3 together with the gate portion GP7 correspond to the transistor P21.

As illustratively shown in FIG. 5, the gate structure GS4 is cut and separated by the cut segment CR2 into gate portions GP4 and GP8. The gate portion GP4 is arranged over the active areas AA1 and AA2. The doped regions NA3, NA4 of the active area AA1 are placed at two opposite sides of the gate portion GP4. The doped regions PA3, PA4 of the active area AA2 are also placed at the two opposite sides of the gate portion GP4.

For illustration of FIG. 5 with reference to FIG. 3, the doped regions NA3 and NA4 of the active area AA1 together with the gate portion GP4 correspond to the transistor N11. The doped regions PA3 and PA4 of the active area AA2 together with the gate portion GP3 correspond to the transistor P11.

As illustratively shown in FIG. 5, the gate portion GP8 is arranged over the active areas AA3 and AA4. The doped regions PA7, PA8 of the active area AA3 are placed at two opposite sides of the gate portion GP8. The doped regions NA7, NA8 of the active area AA4 are also placed at the two opposite sides of the gate portion GP8.

For illustration of FIG. 5 with reference to FIG. 3, the doped regions NA7 and NA8 of the active area AA4 together with the gate portion GP8 correspond to the transistor N23. The doped regions PA7 and PA8 of the active area AA3 together with the gate portion GP8 correspond to the transistor P23.

Further descriptions about relationship between the gate portions GP1-GP4, the active areas AA1-AA2 and the transistors P11-P13, N11-N13 are described in the above embodiments associated with FIG. 4. Therefore, the descriptions are not repeated in embodiments associated with FIG. 5 for brevity.

For illustration of FIG. 5 with reference to FIG. 3, in some embodiments, the doped region NA6 is shared by the source of the transistor N22 and the drain of the transistor N21, which corresponds to the node 325. The doped region PA6 is shared by the source of the transistor P22 and the drain of the transistor P21, which corresponds to the node 323.

For illustration of FIG. 5 with reference to FIG. 3, in some embodiments, the gate portion GP5 which corresponds to the control terminal of the transistor P22 is configured to receive the signal S1b through a via PG3. The gate portion GP6 which corresponds to the control terminal of the transistor N22 is configured to receive the signal S1 through a via NG3. The gate portion GP8 which corresponds to the control terminals of the transistors N23 and P23 is configured to receive the signal S1 through a via NG4. The doped regions NA7 which corresponds to the sources of the transistors N21 and N23 is coupled to the reference voltage terminal VSS through a via NC5. The doped regions PA7 is coupled to the power supply voltage terminal VDD1 through a via PC5 which corresponds to the sources of the transistors P21 and P23.

For illustration of FIG. 5 with reference to FIG. 3, in some embodiments, the doped regions PA5, NA5, NA1, PA1 and the gate portion GP4 are coupled to each other through vias PC4, NC4, PC1, NC1 and NG2, which corresponding to transistors P22, N22, P13, N13, P11 and N11 are coupled to each other at the node 313 in FIG. 3. The gate portion GP7 is coupled to slave latch 204 through a via PG4, which corresponding to the node 321 is coupled to slave latch 204 in FIG. 3. The gate portion GP8 which corresponds to the control terminals of the transistors N23 and P23 is configured to receive the signal S1 through a via NG4, which corresponding to the node 327 in FIG. 3. The doped regions PA8 and NA8 are configured to receive the signal S1b and coupled to each other through vias PC6 and NC6, which corresponding to the node 329 in FIG. 3.

With respect to the design and fabrication of the circuit 110 in FIG. 3 by the schematic layouts 400 and 500 of FIG. 4 and FIG. 5 using SRAM design, the leakage of the retention latch 112 is reduced while the number of the required masks is not increased in some embodiments. Furthermore, in some embodiments, the size of the retention latch 112 using schematic layouts 400 and 500 of SRAM design is reduced.

Also disclosed is a device that includes a master latch, a slave latch and a retention latch. The slave latch is coupled to the master latch. The retention latch is coupled to the master latch and the slave latch, and includes a first active area, a second active area, a first gate structure and a second gate structure. The first active area extends in a first direction. The second active area extends in the first direction.

The first gate structure extends in a second direction which is different from the first direction, the first gate structure including a first portion and a second portion that are separated from each other. The first portion is arranged over the first active area, and the second portion is arranged over the second active area. The second gate structure extends in the second direction, and is arranged over the first active area. The second gate structure is separated from the second active area and the first gate structure in a layout view. An end portion of the second active area is between the first gate structure and the second gate structure.

Also disclosed is a method that includes: generating, based on an electronic architectural design of a memory device, a layout of a flip-flop device, in which the flip-flop device comprises a master latch, a slave latch and a retention latch coupled to each other; fabricating the flip-flop device based on the layout; in which generating the layout of the flip-flop device comprises: arranging a first active area and a second active area that are separated from each other; arranging a plurality of first gates crossing over the first active area and the second active area; arranging a second gate that crosses over the first active area and is separated from the second active area in a layout view; cutting a first one of the first gates into a first gate portion and a second gate portion, in which the first gate portion is arrange over the first active area and the second gate portion is arrange over the second active area.

Also disclosed is a device that includes a master latch, a slave latch and a retention latch. The slave latch is coupled to the master latch. The retention latch is coupled to the master latch and the slave latch, and includes first to fourth active areas and first to fourth gate structures. The first to fourth active areas extends in a first direction and being separated from each other. The first to fourth gate structures extending in a second direction which is different from the first direction. The first gate structure includes first to fourth gate portions that are separated from each other, and arranged over the first to fourth active areas, respectively. The second gate structure is arranged over the first and fourth active areas, separated from the second and third active areas in a layout view. The third gate structure includes fifth and sixth gate portions that are separated from each other. The fifth gate portion is arranged over the first and second active areas, and the sixth gate portion is arranged over the third and fourth active areas. The fourth gate structure is arranged over the third and fourth active areas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a master latch;
   a slave latch coupled to the master latch; and
   a retention latch coupled to the master latch and the slave latch, and comprising:
      a first active area extending in a first direction;
      a second active area extending in the first direction;
      a first gate structure extending in a second direction which is different from the first direction, the first gate structure including a first portion and a second portion that are separated from each other, wherein the first portion is arranged over the first active area, and the second portion is arranged over the second active area; and
      a second gate structure extending in the second direction, and arranged over the first active area, wherein the second gate structure is separated from the second active area and the first gate structure in a layout view,
      wherein an end portion of the second active area is between the first gate structure and the second gate structure.

2. The device of claim 1, wherein the retention latch further comprises:
   a third gate structure extending in the second direction, and arranged over the first active area and the second active area; and
   a fourth gate structure extending in the second direction, and arranged over the first active area and the second active area;
   wherein the third gate structure is arranged between the first gate structure and the fourth gate structure.

3. The device of claim 2, wherein
   the first portion of the first gate structure corresponds to a control terminal of a first transistor,
   the second portion of the first gate structure corresponds to a control terminal of a second transistor,
   the third gate structure corresponds to control terminals of a third transistor and a fourth transistor,
   the fourth gate structure corresponds to control terminals of a fifth transistor and a sixth transistor, and
   the first to sixth transistors are configured to latch a bit of data.

4. The device of claim 1, wherein the first portion of the first gate structure is configured to receive a first operation signal, and the second portion of the first gate structure is configured to receive a second operation signal complementary to the first operation signal.

5. The device of claim 1, wherein the second gate structure and the second active area have a distance therebetween which is shorter than a gate pitch in a layout view.

6. The device of claim 1, wherein the retention latch further comprises:
   a third active area extending in the first direction and separated from the second gate structure; and
   a fourth active area extending in the first direction, wherein the second gate structure is arranged over the fourth active area;
   wherein the first gate structure further includes a third portion arranged over the third active area and a fourth portion arranged over the fourth active area, and
   wherein the first portion to the fourth portion of the first gate are separated from each other.

7. The device of claim 6, wherein the second gate structure and the third active area have a distance therebetween which is shorter than a gate pitch.

8. The device of claim 6, wherein the retention latch further comprises:
   a third gate structure extending in the second direction, arranged over the third active area and the fourth active area;
   wherein the first gate structure is arranged between the second gate structure and the third gate structure.

9. The device of claim 8, wherein
the third and fourth portion corresponds to control terminals of a first transistor and a second transistor, respectively, and
the third gate structure corresponds to control terminals of a third transistor and a fourth transistor, the first to fourth transistors are configured to operate as an inverter coupled to a transmission gate.

10. The device of claim 6, wherein the retention latch further comprises:
a third gate structure extending in the second direction, and including a fifth portion and a sixth portion that are separated from each other,
wherein the fifth portion is arranged over the first active area and the second active area, and the sixth portion is arranged over the third active area and the fourth active area, and
wherein the first gate structure is arranged between the second gate structure and the third gate structure.

11. The device of claim 10, wherein
the first to fourth portions of the first gate structure corresponds to control terminals of first to fourth transistors, respectively,
the fifth portions of the third gate structure corresponds to control terminals of a fifth transistor and a sixth transistor,
the sixth portion of the third gate structure corresponds to control terminals of a seventh transistor and a eighth transistor,
the first, second, fifth and sixth transistors are configured to operate as a first inverter coupled to a first transmission gate, and
the third, fourth, seventh and eighth transistors are configured to operate as an second inverter coupled to a second transmission gate.

12. A method, comprising:
generating, based on an electronic architectural design of a memory device, a layout of a flip-flop device, wherein the flip-flop device comprises a master latch, a slave latch and a retention latch coupled to each other; and
fabricating the flip-flop device based on the layout;
wherein generating the layout of the flip-flop device comprises:
arranging a first active area and a second active area that are separated from each other;
arranging a plurality of first gates crossing over the first active area and the second active area;
arranging a second gate that crosses over the first active area and is separated from the second active area in a layout view; and
cutting a first one of the first gates into a first gate portion and a second gate portion, wherein the first gate portion is arrange over the first active area and the second gate portion is arrange over the second active area.

13. The method of claim 12, further comprising:
latching a bit of data by first to sixth transistors, wherein
the first and the second gate portion correspond to control terminals of the first and second transistors, respectively,
a second one of the first gates corresponds to control terminals of the third and the fourth transistors, and
a third one of the first gates corresponds to control terminals of the fifth and the sixth transistors.

14. The method of claim 12, wherein generating the layout of the flip-flop device further comprises:
arranging an end portion of the second active area between the second gate portion and the second gate.

15. The method of claim 12, further comprising:
selecting the electronic architectural design of the memory device, from a cell library used for design of the layout, wherein the memory device corresponds to a static random access memory device.

16. The method of claim 12, wherein generating the layout of the flip-flop device further comprises:
arranging a third active area and a fourth active area that are separated from each other, wherein the second active area and the third active area are arranged between the first active area and the fourth active area;
cutting the first one of the first gates into a third gate portion and a fourth gate portion, wherein the third gate portion is arrange over the third active area and the fourth gate portion is arrange over the fourth active area; and
cutting a second one of the first gates into a fifth gate portion and a sixth gate portion, wherein the fifth gate portion is arrange over the first and second active areas, and the sixth gate portion is arrange over the third and fourth active areas.

17. The method of claim 16, further comprising:
receiving, by the third gate portion, a first operation signal;
receiving, by the fourth gate portion, a second operation signal complementary to the first operation signal;
wherein the third gate portion and the fourth gate portion correspond to control terminals of a first transistor and a second transistor, respectively,
wherein the sixth gate portion is correspond to control terminals of a third transistor and a fourth transistor,
wherein the first to fourth transistors are configured to operate as an inverter coupled to a transmission gate.

18. A device comprising:
a master latch;
a slave latch coupled to the master latch; and
a retention latch coupled to the master latch and the slave latch, and comprising:
first to fourth active areas extending in a first direction and being separated from each other; and
first to fourth gate structures extending in a second direction which is different from the first direction,
wherein the first gate structure includes first to fourth gate portions that are separated from each other, and arranged over the first to fourth active areas, respectively,
wherein the second gate structure is arranged over the first and fourth active areas, separated from the second and third active areas in a layout view,
wherein the third gate structure includes fifth and sixth gate portions that are separated from each other, wherein the fifth gate portion is arranged over the first and second active areas, and the sixth gate portion is arranged over the third and fourth active areas,
wherein the fourth gate structure is arranged over the third and fourth active areas.

19. The device of claim 18, wherein
the first to fourth gate portions corresponds to a control terminals of first to fourth transistors, respectively,
the fifth gate portion corresponds to control terminals of fifth and sixth transistors,
the sixth gate portion corresponds to control terminals of seventh and eighth transistors, and the fourth gate structure corresponds to control terminals of ninth and tenth transistors, wherein the first, second, fifth and sixth transistors are configured to operate as a first inverter coupled to a first transmission gate, wherein the third, fourth, seventh and eighth transistors are configured to operate as a second inverter coupled to a second transmission gate, wherein the ninth and tenth transistors are configured to operate as a third inverter coupled between first and second control terminals of the second transmission gate.

20. The device of claim 19, wherein the retention latch further comprises:

a fifth gate structure extending in the second direction and arranged over the first and second active areas, wherein the fifth gate structure configured to operate as a first terminal of a fourth inverter, wherein the first terminal of the fourth inverter is coupled to first terminals of the first and second transmission gates, and a second terminal of the fourth inverter is coupled to a first terminal of the first inverter.

* * * * *